(12) United States Patent
Niijima et al.

(10) Patent No.: US 8,014,969 B2
(45) Date of Patent: Sep. 6, 2011

(54) TEST APPARATUS, TEST METHOD AND MANUFACTURING METHOD

(75) Inventors: Hirokatsu Niijima, Tokyo (JP); Koji Hara, Tokyo (JP); Noriyoshi Kozuka, Tokyo (JP); Kohei Shibata, Tokyo (JP); Tetsuya Sakaniwa, Tokyo (JP)

(73) Assignee: Advantest Corporation, Tokyo (JP)

( * ) Notice: Subject to any disclaimer, the term of this patent is extended or adjusted under 35 U.S.C. 154(b) by 687 days.

(21) Appl. No.: 11/964,719

(22) Filed: Dec. 27, 2007

(65) Prior Publication Data

US 2009/0240365 A1  Sep. 24, 2009

Related U.S. Application Data

(63) Continuation of application No. PCT/JP2007/066136, filed on Aug. 20, 2007.

(60) Provisional application No. 60/849,710, filed on Oct. 5, 2006.

(51) Int. Cl.
*G01D 3/00* (2006.01)

(52) U.S. Cl. .......... 702/118; 702/85; 702/108; 702/110; 702/117; 702/120; 702/124; 700/110; 174/27; 174/E11.002

(58) Field of Classification Search ............ 702/118
See application file for complete search history.

(56) References Cited

U.S. PATENT DOCUMENTS

| | | | |
|---|---|---|---|
| 5,311,473 A * | 5/1994 | McClure et al. | 365/201 |
| 6,437,593 B1 | 8/2002 | Ito et al. | |
| 6,677,745 B2 * | 1/2004 | Mayr et al. | 324/158.1 |
| 6,728,652 B1 | 4/2004 | Kobayashi | |
| 2003/0110427 A1 * | 6/2003 | Rajsuman et al. | 714/724 |

FOREIGN PATENT DOCUMENTS

| | | |
|---|---|---|
| JP | 57-050666 | 3/1982 |
| JP | 08-102199 | 4/1996 |
| JP | 11-064454 | 3/1999 |
| JP | 11-311661 | 11/1999 |
| JP | 2003-007087 | 1/2003 |
| JP | 2007-047098 | 2/2007 |
| TW | 484013 B | 4/2002 |
| TW | 531652 B | 5/2003 |

OTHER PUBLICATIONS

JP11-311661 (machine translated).*
JP11-064454 (machine translated).*
JP08-102199 (machine translated).*
Taiwanese Office Action for Taiwanese Application No. 096138986 dated Apr. 7, 2011, and English translation thereof, 9 pages.

* cited by examiner

*Primary Examiner* — Drew A Dunn
*Assistant Examiner* — Hyun Park
(74) *Attorney, Agent, or Firm* — Osha • Liang LLP

(57) ABSTRACT

There is provided a test apparatus for testing a plurality of devices under test. The test apparatus includes a signal input section that applies a test signal to the devices under test so as to cause the devices under test to concurrently output response signals, a combining section that generates a single combination signal by using the response signals output from the devices under test, and a judging section that judges whether the devices under test operate normally with reference to the combination signal.

9 Claims, 10 Drawing Sheets

|  | WRITING | INDIVIDUAL READING | | | | CONCURRENT READING |
| --- | --- | --- | --- | --- | --- | --- |
|  |  | 200-1 | 200-2 | ... | 200-8 |  |
| 54-1 | ON | ON | OFF | ... | OFF | OFF |
| 54-2 | ON | OFF | ON | ... | OFF | OFF |
| 54-3 | ON | OFF | OFF | ... | OFF | OFF |
| 54-4 | ON | OFF | OFF | ... | OFF | OFF |
| 54-5 | ON | OFF | OFF | ... | OFF | OFF |
| 54-6 | ON | OFF | OFF | ... | OFF | OFF |
| 54-7 | ON | OFF | OFF | ... | OFF | OFF |
| 54-8 | ON | OFF | OFF | ... | ON | OFF |
| 54-n | OFF | OFF | OFF | OFF | OFF | ON |

FIG. 7

TEST APPARATUS, TEST METHOD AND MANUFACTURING METHOD

CROSS REFERENCE TO RELATED APPLICATION

This is a continuation application of PCT/JP2007/066136 filed on Aug. 20, 2007 which claims priority from a U.S. Provisional Application No. 60/849,710, filed on Oct. 5, 2006, the contents of which are incorporated herein by reference.

BACKGROUND

1. Technical Field

The present invention relates to a test apparatus, a test method and a manufacturing method of an electronic device. More particularly, the present invention relates to a test apparatus and a test method for testing a plurality of devices under test in parallel, and to a manufacturing method utilizing the test method.

2. Related Art

To test a plurality of devices under test in parallel, a known method writes common data to the devices under test, and reads the data stored on each of the devices under test. In this manner, the method tests whether each of the devices under test normally operates. Please refer to Unexamined Japanese Patent Application Publication No. 2007-47098, for example. According to this testing method, the common data is written into the devices under test in the data writing process. Therefore, when applied to the devices under test, the data to be written branches so as to be written into the devices under test concurrently.

Referring to this testing method, measuring sections are provided in a one-to-one correspondence with the devices under test to measure the data from the devices under test. With such a configuration, it is possible to read concurrently the data from the devices under test. However, a large number of measuring sections are required to conduct the measurement on a large number of devices under test.

To overcome this drawback, one measuring section may be provided in correspondence with a plurality of devices under test, and the outputs from the respective devices under test are applied to the single measuring section in a time-sharing manner. In other words, the devices under test are adjusted so as to output data at sequentially delayed timings, so that the data from the devices under test are serially applied to the single measuring section. With the above configuration, the single measuring section can measure the data from the large number of devices under test. This method, however, also has a problem. Since the data is read from the devices under test serially, testing eight devices under test requires an eight times longer measuring time than testing a single device under test, for example.

SUMMARY

Therefore, it is an object of an aspect of the innovations herein to provide a test apparatus, a test method and a manufacturing method which are capable of overcoming the above drawbacks accompanying the related art. The above and other objects can be achieved by combinations described in the independent claims. The dependent claims define further advantageous and exemplary combinations of the innovations herein.

According to an aspect related to the innovations herein, one exemplary test apparatus may include a test apparatus for testing a plurality of devices under test. The test apparatus includes a signal input section that applies a test signal to the devices under test so as to cause the devices under test to concurrently output response signals, a combining section that generates a single combination signal by using the response signals output from the devices under test, and a judging section that judges whether the devices under test operate normally with reference to the combination signal.

According to an aspect related to the innovations herein, one exemplary test method may include a test method for testing a plurality of devices under test. The test method includes applying a test signal to the devices under test so as to cause the devices under test to concurrently output response signals, generating a single combination signal by using the response signals output from the devices under test, and judging whether the devices under test operate normally with reference to the combination signal.

According to an aspect related to the innovations herein, one exemplary manufacturing method may include a manufacturing method for manufacturing electronic devices. The manufacturing method includes forming a plurality of electronic devices, and selecting one or more of the electronic devices which operate normally by testing the formed electronic devices, to manufacture normally-operating electronic devices. Here, the selecting includes applying a test signal to the electronic devices so as to cause the electronic devices to concurrently output response signals, generating a single combination signal by using the response signals output from the electronic devices, and judging whether the electronic devices under test operate normally with reference to the combination signal.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 2A illustrates, as an example, the data values (Data) of the response signals (Sout) output when the test apparatus 100 shown in FIG. 1 is used, and FIG. 2B illustrates, as an example, the data values (Data) of the response signals (Sout) output in a conventional test method.

FIG. 7 illustrates an exemplary operation of switches 54.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
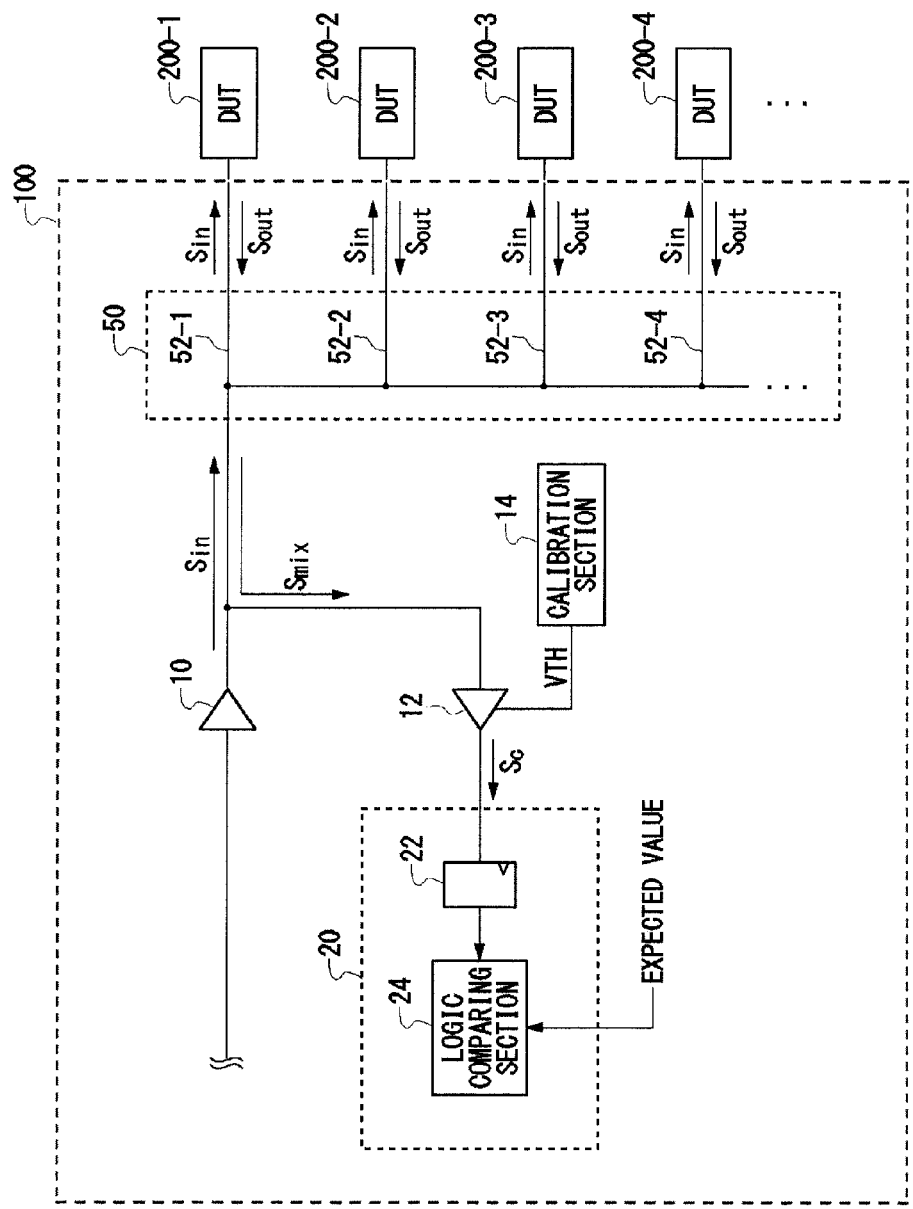
FIG. 1 illustrates an exemplary configuration of a test apparatus 100 relating to an embodiment of the present invention.

FIG. 1 illustrates an exemplary configuration of a test apparatus 100 relating to an embodiment of the present invention. The test apparatus 100 tests a plurality of devices under test 200 in parallel. The devices under test 200 are electronic devices such as semiconductor chips and semiconductor memories. The test apparatus 100 tests the devices under test 200 which have the same functionality and configuration. The test apparatus 100 includes therein a signal input section 10, a level comparing section 12, a calibration section 14, a judging section 20 and a combining section 50.

The signal input section 10 applies a test signal Sin to the devices under test 200. The signal input section 10 may be a driver that receives a test pattern shaped by the preceding stages such as a pattern generator and a waveform shaper (not shown in FIG. 1), converts the received test pattern into a level signal having a predetermined amplitude to generate the test signal Sin, and applies the generated test signal Sin to the devices under test 200 via wires 52.

When the devices under test 200 are semiconductor memories, each device under test 200 includes therein approximately 1 to 32 I/O signal terminals for data writing/reading, a plurality of address signal terminals, a CE signal terminal, a WE signal terminal, an OE signal terminal, and other terminals. When the devices under test 200 are flash memories, each device under test 200 may be configured such that the address in the memory and the reading/writing operation mode are designated through the I/O signal terminals thereof.

According to the present example, the test signal Sin output from the signal input section 10 is branched by the combining section 50, and each of the resulting signals supplied to a single I/O signal terminal of a corresponding one of the devices under test 200. On the other hand, the response signals Sout output from the I/O signal terminals of the devices under test 200 are combined by the combining section 50, and the resulting signal is supplied to the level comparing section 12.

FIG. 1 is a simplified view illustrating the I/O signal terminals of single-channel devices under test 200. Therefore, FIG. 1 does not show therein other terminals of the devices under test 200 (including the address signal terminals, CE signal terminals, WE signal terminals, OE signal terminals). According to the test apparatus 100 relating to the present example, a signal input section 10 different from the signal input section 10 shown in FIG. 1 applies a control signal indicating the same timing to each device under test 200 at the CE signal terminal/OE signal terminal thereof, in order to cause each device under test 200 to output the same response signal Sout concurrently. The signal input section 10 shown in FIG. 1 may apply the same test signal Sin to the devices under test 200 concurrently. According to the present example, the test signal Sin output from the signal input section 10 branches into the wires 52 having the same transmission delay amount, and the resulting test signals Sin are transmitted via the wires 52. In this way, the resulting test signals Sin are applied to the devices under test 200 concurrently.

According to the present example, each device under test 200 outputs the response signal Sout in response to the received test signal Sin at the timing determined by the control signal supplied thereto. The combining section 50 combines the response signals Sout individually output from the devices under test 200 in an analog manner, to generate a single combination signal Smix. Combining the response signals Sout in an analog manner indicates, for example, generating a signal having an analog signal level determined by the signal levels of the response signals Sout.

According to the present example, the combining section 50 includes therein the wires 52 provided in a one-to-one correspondence with the devices under test 200. Each wire 52 electrically connects the output terminal (I/O signal terminal) of a corresponding one of the devices under test 200 and the signal input terminal of the level comparing section 12 to each other. Each wire 52 preferably has substantially the same characteristics including the transmission delay amount and the attenuation amount. With the above configuration, the combining section 50 can generate the combination signal Smix by combining the signal levels of the response signals Sout, and apply the generated combination signal Smix to the level comparing section 12.

The level comparing section 12 outputs a level comparison result signal Sc which indicates whether the signal level of the combination signal Smix is higher than a predetermined threshold value VTH. For example, the level comparing section 12 outputs the logic value H during a time period during which the signal level of the combination signal Smix is higher than the threshold value VTH. The level comparing section 12 outputs the logic value L during a time period during which the signal level of the combination signal Smix is lower than or equal to the threshold value VTH.

FIG. 1 shows an exemplary configuration with a single system, according to which the signal level of the combination signal Smix is compared to the single threshold value VTH. According to a different example, the test apparatus 100 may include a first system and a second system. The first system uses a threshold value VTH corresponding to the combination signal Smix generated when the response signals output from all of the devices under test 200 have the H level. The second system uses a threshold value VTH corresponding to the combination signal Smix generated when the response signals output from all of the devices under test 200 have the L level. For example, the test apparatus 100 may include therein two systems each of which is constituted by the calibration section 14, the level comparing section 12 and the judging section 20.

The judging section 20 judges, for all of the devices under test 200 as a whole, whether the devices under test 200 normally operate with reference to the combination signal Smix. For example, the judging section 20 may judge whether all of the devices under test 200 normally operate, with reference to the judgment as to whether the signal level of the combination signal Smix is higher than the predetermined threshold value VTH at a predetermined timing. According to the present example, the judging section 20 judges whether the logic value of the level comparison result signal Sc output from the level comparing section 12 matches a predetermined expected value at a predetermined timing. With reference to this judgment, the judging section 20 collectively judges whether all of the devices under test 200 normally operate. Here, the expected value may be supplied to the judging section 20 from a pattern generator (not shown in FIG. 1). The pattern generator may vary the expected value in each test cycle.

The judging section 20 includes therein a timing comparing section 22 and a logic comparing section 24. The timing comparing section 22 latches the logic value of the level comparison result signal Sc output from the level comparing section 12 in accordance with a strobe signal defining the latch timing and obtains the latched logic value. The timing indicated by the strobe signal is preferably the timing at which the signal level of the combination signal Smix, which is generated by combining the response signals Sout in an analog manner, is stabilized.

The logic comparing section 24 compares the logic value obtained by the timing comparing section 22 with the predetermined expected value, to judge whether all of the devices under test 200 normally operate. When all of the devices under test 200 are non-defective, the response signals Sout output from the devices under test 200 may have the same voltage level. In this case, the combination signal Smix, which is generated by combining the response signals Sout in an analog manner, has a voltage level substantially equal to the voltage level of the response signal Sout output from one of the devices under test 200. On the other hand, when at least one of the devices under test 200 is defective, the combination signal Smix has a different voltage level from when all of the devices under test 200 are non-defective.

Considering the above, the threshold value VTH may be set to the level comparing section 12 so as to distinguish between a first signal level of the combination signal Smix which is generated when all of the devices under test 200 output a logic value indicating normal operation and a second signal level of the combination signal Smix which is generated when one of the devices under test 200 outputs a logic value indicating abnormal operation and the remaining devices under test 200 output a logic value indicating normal operation, for example. With such a configuration, the judging section 20 can judge whether all of the devices under test 200 normally operate or at least one of the devices under test 200 operates abnormally. Generally speaking, the ratio of defective devices is extremely low when the devices under test 200 are obtained, for example, at the mass production phase.

The threshold value VTH may be set in advance by the calibration section 14. The calibration section 14 may measure in advance the voltage level of the combination signal Smix which is generated when the calibration section 14 causes at least one of the devices under test 200 to output a response signal Sout having a different logic value from the remaining devices under test 200. For example, the calibration section 14 may measure in advance the above-mentioned first and second signal levels.

In this case, the calibration section 14 may set the threshold value at the level comparing section 12 so as to be positioned substantially in the middle between the first and second signal levels. By performing the above-mentioned calibration, the calibration section 14 can optimally set the threshold value VTH. Therefore, the calibration section 14 can optimally set the threshold value VTH even when the voltage levels of the devices under test 200 differ from each other depending on the product types of the devices under test 200. The calibration section 14 may perform the above-mentioned calibration to calculate the optimal threshold value VTH each time the set of devices under test 200 is replaced by the next set.

The calibration section 14 may sequentially vary the number of devices under test 200 which are caused to output an abnormal logic value, so as to measure the signal level of the combination signal Smix in association with each number of the devices under test 200 which are caused to output an abnormal logic value. In this case, following the judgment that at least one of the devices under test 200 is abnormal during the test of the devices under test 200, the calibration section 14 may measure the signal level of the combination signal Smix while sequentially varying the threshold value VTH, to determine the number of abnormal devices under test 200. The calibration section 14 may sequentially set the threshold value VTH at different values, for example, by using binary search.

Figure 2A:
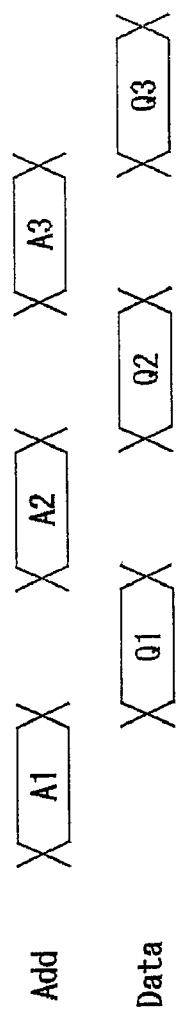
FIGS. 2A and 2B illustrate, as an example, the data values (Data) of response signals (Sout) output from a plurality of devices under test 200, where
Figure 2B:
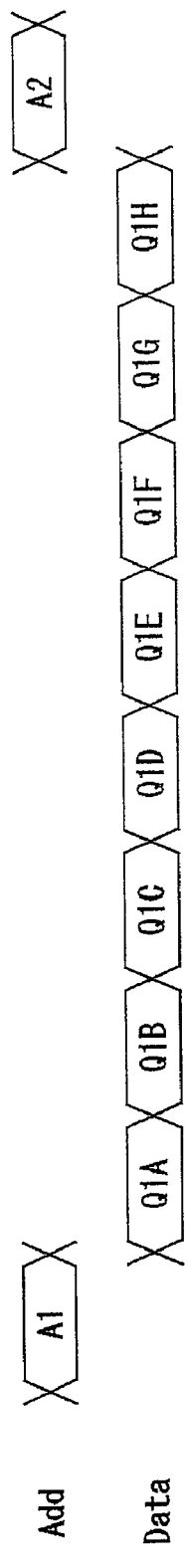

FIGS. 2A and 2B illustrate, as an example, data values (Data) of the response signals Sout output from the devices under test 200. The following description of the present example is made under an assumption that the devices under test 200 are flash memories which are configured such that the addresses in the memories and the reading/writing operation are designated via the I/O signal terminals. FIG. 2A illustrates, as an example, the data values (Data) of the response signals Sout output when the test apparatus 100 shown in FIG. 1 is used.

The test apparatus 100 applies the common test signal (A1) to the devices under test 200. The test signal (A1) indicates, for example, an address to which data is to be written, or from which data is to be read. The individual devices under test 200 concurrently output response signals (Q1) read from the address corresponding to the test signal (A1). With reference to the response signals (Q1), the test apparatus 100 judges whether the devices under test 200 are acceptable. After the judgment, the test apparatus 100 applies the next test signal (A2) to the devices under test 200. In the same manner, the test apparatus 100 repeatedly judges whether the devices under test 200 are acceptable with reference to the response signals received in response to each test signal.

FIG. 2B illustrates, as an example, the data values (Data) of the response signals Sout output in a conventional test method. According to the conventional test method, the data values (Q1A to Q1H) of the response signals Sout output from the devices under device 200 are serially read. Therefore, when compared with the case shown in FIG. 2A, the time required to read the data values of the response signals Sout increases in proportion to the number of devices under test 200. For example, when eight devices under test 200 are tested, the conventional method requires an eight times longer time to read the response signals Q1 (Q1A to Q1H) than the present embodiment.

As described above, the test apparatus 100 relating to the present example can significantly reduce the time required to read the response signals Sout when compared with the conventional test method. As a result, the test apparatus 100 relating to the present example can significantly improve the throughput, thereby reducing the testing cost. Note that, however, the test apparatus 100 collectively judges whether all of the devices under test 200 operate normally, for example. Therefore, when the test apparatus 100 detects the abnormality, it is not known which one or more of the devices under test 200 are abnormal in the present embodiment.

Figure 5:
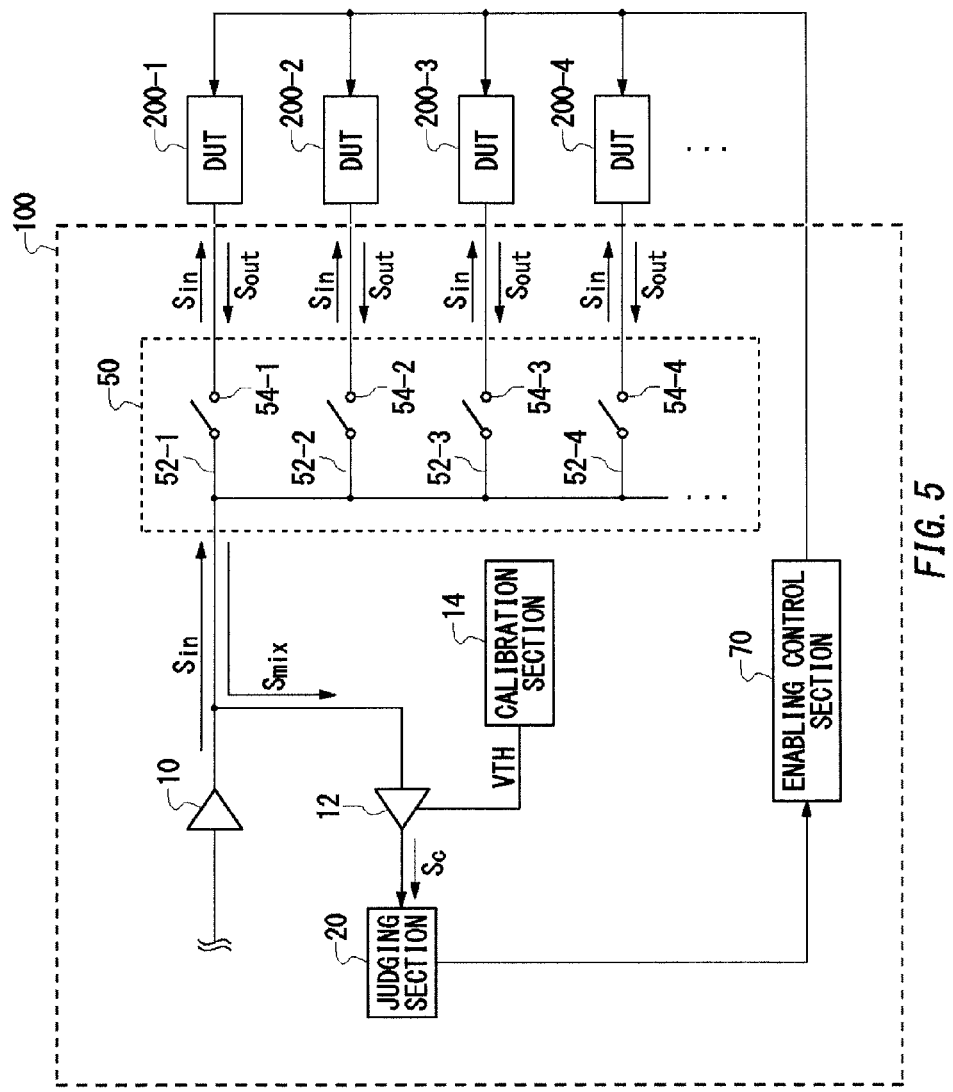
FIG. 5 illustrates a different exemplary configuration of the test apparatus 100.

Generally speaking, however, the ratio of defective devices is extremely low when the devices under test 200 are obtained at the mass production phase, for example. Therefore, the test apparatus 100 judges that all of the devices under test 200 operate normally in most of the tests. According to the present embodiment, when detecting one or more of the devices under test 200 operate abnormally, the test apparatus 100 needs to perform the series of operations to individually judge whether the devices under test 200 are acceptable as described later with reference to FIG. 5. In spite of this drawback, the test apparatus 100 relating to the present embodiment can test the devices under test 200 more efficiently than the conventional test method for the above reason. Note that switches 54 shown in FIG. 5 are omitted when each device under test 200 has, for example, a function of prohibiting the output of the response signal which is realized by the control signal such as an OE signal and the control signal makes it possible to individually judge whether the devices under test 200 are acceptable.

Figure 3:
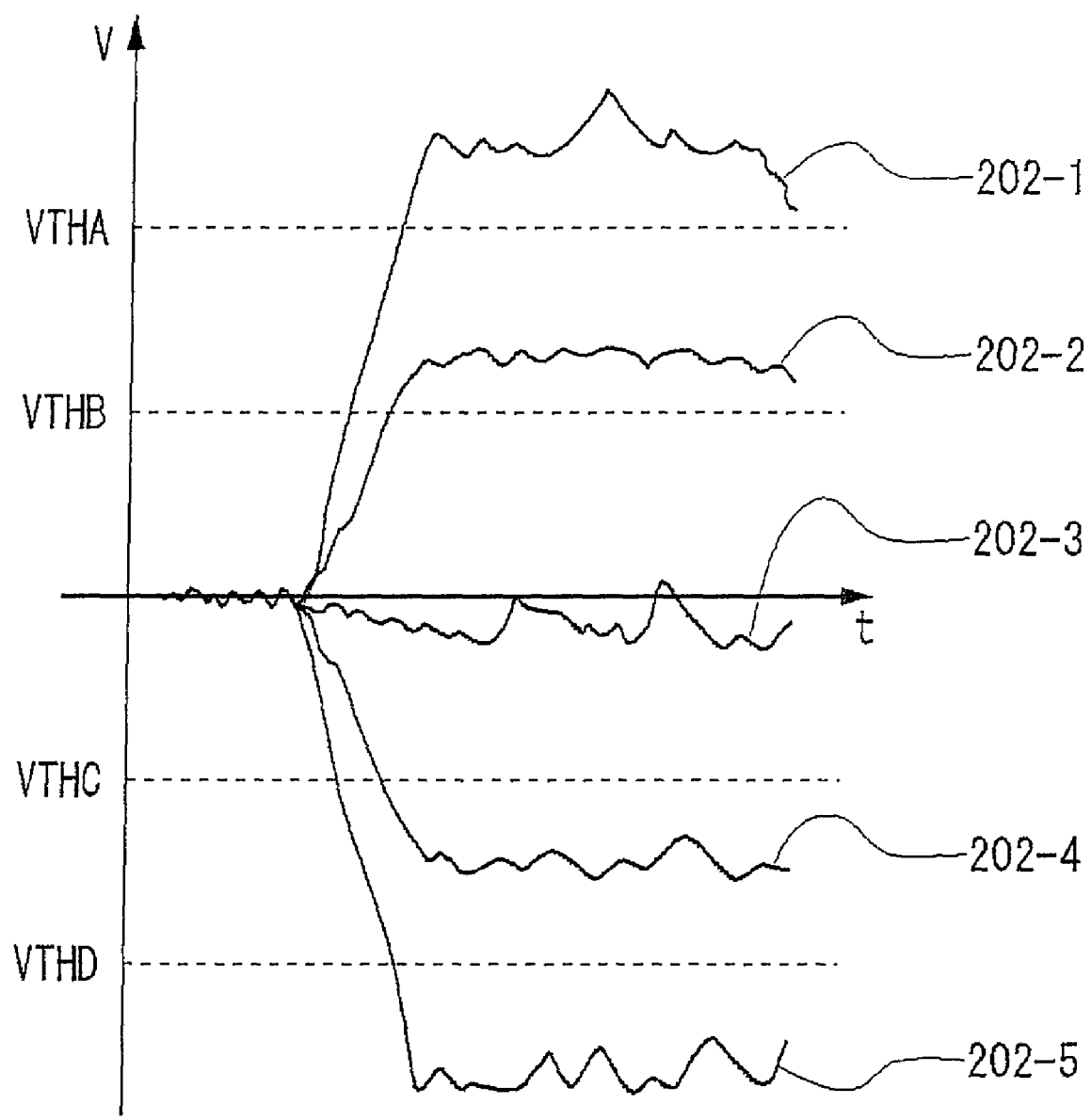
FIG. 3 illustrates exemplary waveforms of a combination signal Smix in association with the number of defective devices under test 200.
Figure 4:
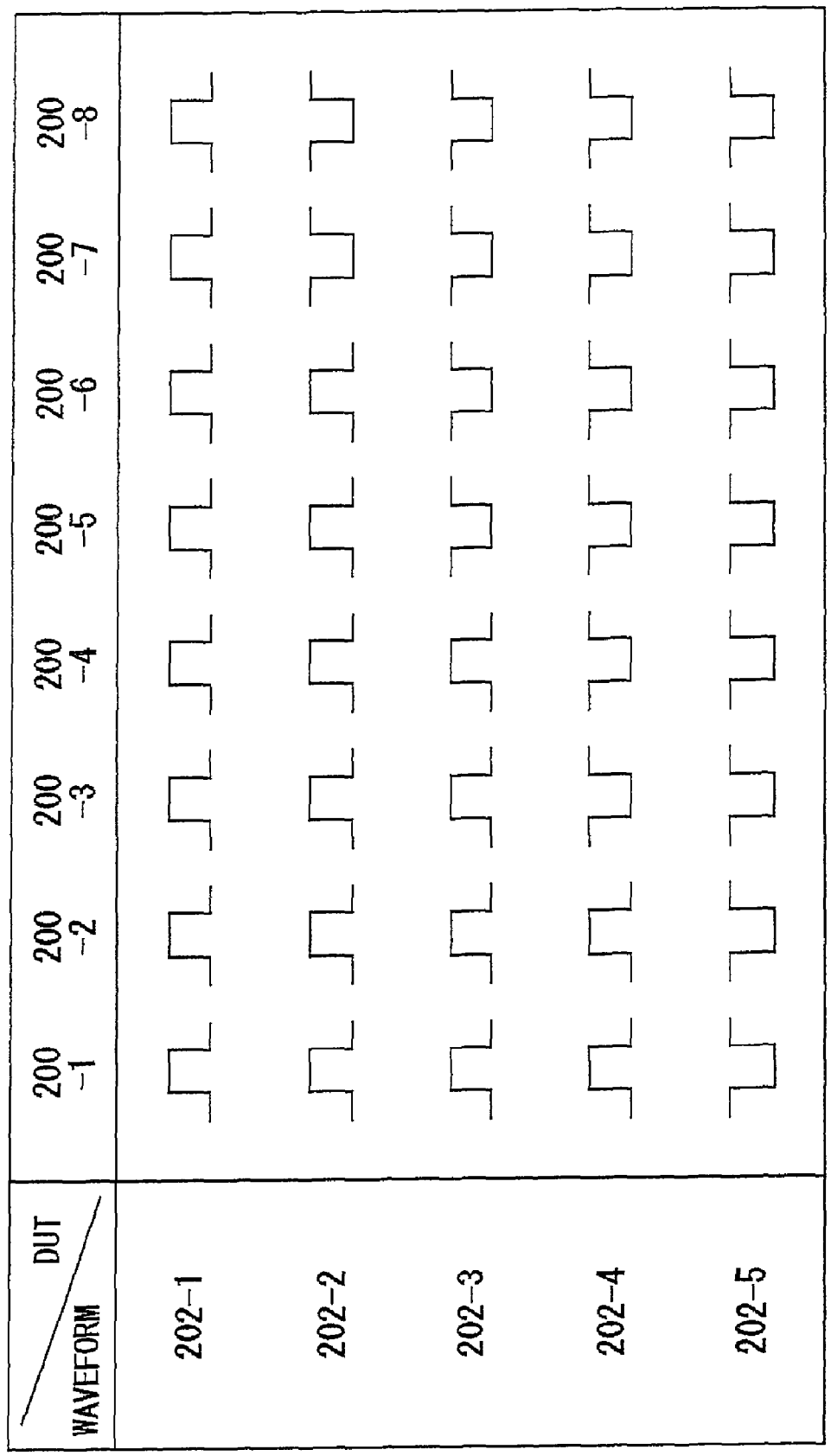
FIG. 4 illustrates exemplary patterns formed by the logic values output from the devices under test 200.

FIG. 3 illustrates exemplary waveforms of the combination signal Smix in association with the number of defective devices under test 200. FIG. 4 illustrates exemplary patterns of the logic values output from the devices under test 200. According to the present example, it is assumed that the test apparatus 100 tests eight devices under test 200 in parallel.

When all of the devices under test 200 output the H logic as shown in the first row in FIG. 4, the combination signal Smix has a waveform 202-1 shown in FIG. 3, for example. The signal level V1 of the waveform 202-1 may be substantially equal to the signal level of the response signal Sout which is seen when one of the devices under test 200 outputs the H logic.

When all of the devices under test 200 output the L logic as shown in the fifth row in FIG. 4, the combination signal Smix has a waveform 202-5 shown in FIG. 3, for example. The signal level V5 of the waveform 202-5 may be substantially equal to the signal level of the response signal Sout which is seen when one of the devices under test 200 outputs the L logic.

When six of the devices under test 200 output the H logic and the remaining two devices under test 200 output the L logic as shown in the second row in FIG. 4, the combination signal Smix has a waveform 202-2 shown in FIG. 3, for example. The signal level V2 of the waveform 202-2 is equal to the result of adding 6/8 of the difference in signal level between the waveform 202-1 and the waveform 202-5 to the signal level V5 of the waveform 202-5, in other words, $V2=V5+(V1-V5)\times 6/8$. The signal levels of the waveforms seen when the devices under test 200 output the logic values as shown in the third and fourth rows in FIG. 4 can be calculated in the same manner. As discussed above, the signal level of the combination signal Smix varies in accordance with the number of devices under test 200 which output a different logic value.

The calibration section 14 may measure these signal levels of the combination signal Smix in advance and calculate the threshold values VTHA, VTHB, . . . used to distinguish between the respective signal levels as discussed in the preceding part. Alternatively, the calibration section 14 may select a necessary threshold value and calculate the necessary threshold value. For example, the calibration section 14 may calculate two threshold values VTHA and VTHD which are used to judge whether all of the devices under test 200 are defective and whether all of the devices under test 200 are non-defective. Alternatively, the calibration section 14 may calculate the signal levels of the respective waveforms based on the signal having the waveform 202-1, the signal level of the waveform 202-5, and the total number of the devices under test 200.

Here, the above-described test method can not detect defective devices when the devices under test 200 have a problem not because the devices under test 200 output the abnormal logic value but because the outputs are fixed to high impedance. Therefore, the judging section 20 preferably examines whether the output of each device under test 200 is fixed to high impedance, before the test apparatus 100 starts testing the devices under test 200 with reference to the combination signal Smix. The examination as to whether the output of each device under test 200 is fixed to high impedance may be done by a known method.

FIG. 5 illustrates a different exemplary configuration of the test apparatus 100. According to the present example, the test apparatus 100 further includes therein an enabling control section 70 in addition to the constituents of the test apparatus 100 described with reference to FIGS. 1 to 4. Furthermore, the combining section 50 additionally includes therein a plurality of switches 54 which can be turned on/off. The remaining constituents of the test apparatus 100 relating to the present example may be the same as the corresponding constituents of the test apparatus 100 described with reference to FIGS. 1 to 4.

When judging that one or more of the devices under test 200 do not operate normally, the judging section 20 relating to the present example judges, for each device under test 200, whether the device under test 200 operates normally. For example, when detecting that at least one of the devices under test 200 is defective with reference to the combination signal Smix, the judging section 20 identifies one or more defective devices under test 200 with reference to the individual response signals Sout.

By controlling the respective switches 54, the judging section 20 judges whether each device under test 200 is acceptable. For example, to judge whether the device under test 200-1 is acceptable, the judging section 20 turns on the switch 54-1 and turns off the remaining switches 54. Under such a condition, the judging section 20 compares the logic value of the response signal Sout from the device under test 200-1 with the expected value, to judge whether the device under test 200-1 is acceptable. In this case, the threshold value VTH supplied to the level comparing section 12 may be the same as the threshold value used for the combination signal Smix. The judging section 20 repeatedly performs the above series of operations on all of the devices under test 200. In this manner, the judging section 20 can distinguish between the non-defective and defective devices under test 200.

According to the above, the judging section 20 judges whether each one of the devices under test 200 is acceptable. According to a different example, however, the judging section 20 may divide the devices under test 200 into two groups, and collectively judge whether all of the devices under test 200 in each group are acceptable. This alternative method can reduce the number of times at which the judging section 20 makes the judgment.

For example, when judging whether eight devices under test 200 are acceptable, the judging section 20 may divide the devices under test 200 into two groups of four. In this case, the combination signal Smix is generated in association with each group, and the judging section 20 may judge whether all of the devices under test 200 in each group are acceptable.

For example, the judging section 20 turns on the switches 54-1 to 54-4, and turns on the switches 54-5 to 54-8. Under this condition, the judging section 20 causes the signal input section 10 to output the test signal Sin. Following this, the combining section 50 generates the combination signal Smix by combining the response signals Sout output from the devices under test 200-1 to 200-4. The judging section 20 judges whether all of the devices under test 200-1 to 200-4 are acceptable with reference to the generated combination signal Smix.

The test apparatus 100 performs the above series of operations for each group. In a case where there is a group including at least one defective device under test 200, the judging section 20 further divides the devices under test 200 included in the group into groups of a smaller number, and the test apparatus 100 performs the above series of operations. In this manner, the judging section 20 can identify one or more defective devices under test 200. Here, the calibration section 14 may adapt the threshold value VTH to the number of devices under test 200 included in each group.

The enabling control section 70 supplies a signal indicating that the response signal Sout is prohibited from being output to one or more of the devices under test 200 which are judged by the judging section 20 not to operate normally, while permitting the test apparatus 100 to continue testing the remaining devices under test 200. For example, the enabling control section 70 may fix, to high impedance, the output terminals of the devices under test 200 judged not to operate normally. With such a configuration, while preventing the devices under test 200 judged not to operate normally from affecting the remaining devices under test 200, the test apparatus 100 can continue testing the remaining devices under test 200. Alternatively, the enabling control section 70 may turn off the switches 54 corresponding to the devices under test 200 judged not to operate normally.

Figure 6:
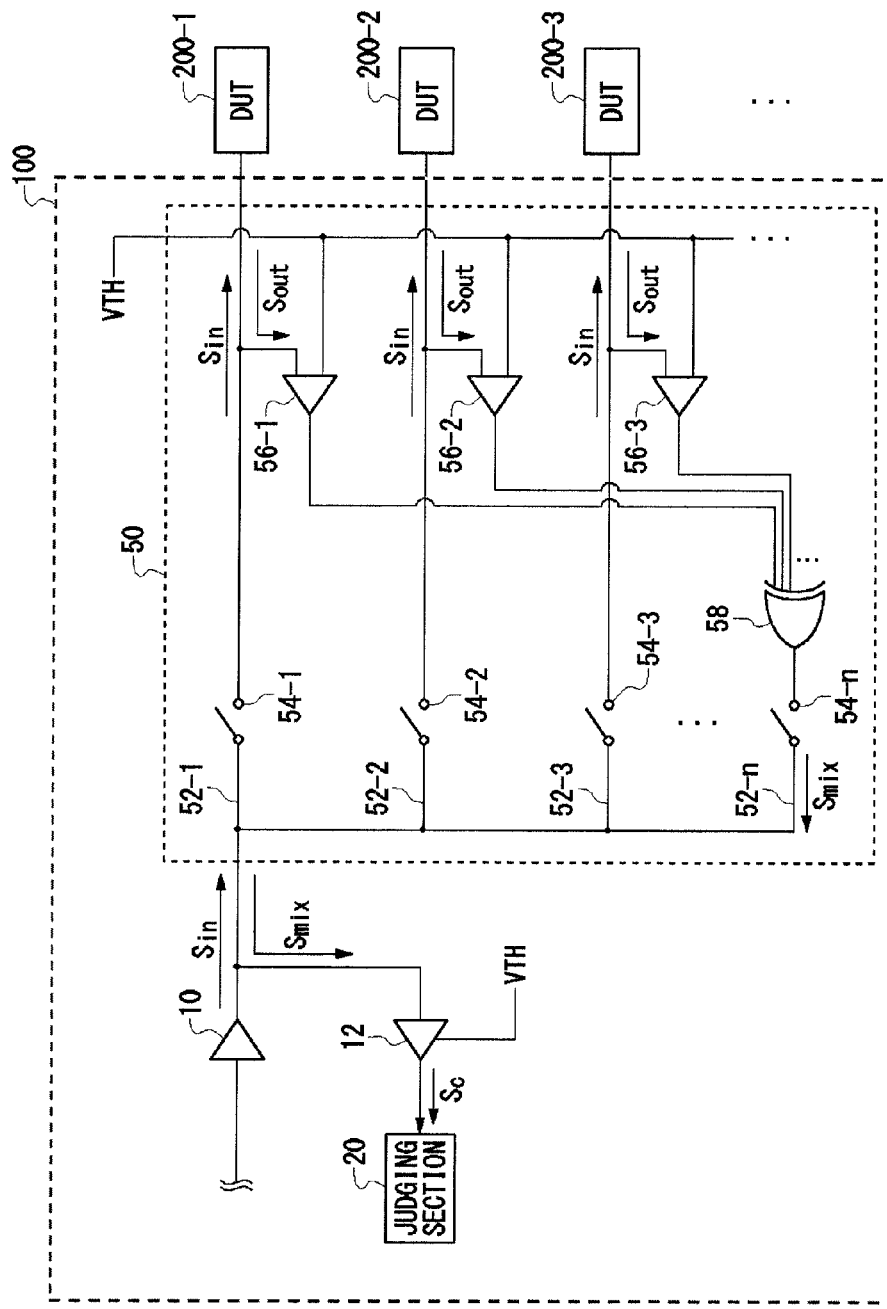
FIG. 6 illustrates a different exemplary configuration of the test apparatus 100.

FIG. 6 illustrates a different exemplary configuration of the test apparatus 100. The test apparatus 100 relating to the present example is different from the test apparatuses 100 described with reference to FIGS. 1 to 5 in terms of the configuration of the combining section 50. Except for this difference, the test apparatus 100 relating to the present example may be the same as the test apparatuses 100 described with reference to FIGS. 1 to 5.

According to the present example, the combining section 50 converts the response signals Sout output from all of the devices under test 200 into logic signals, judges whether all of the logic signals indicate the same logic value at a predetermined timing, and outputs a signal indicating the judgment result as the combination signal Smix. For example, the signal indicating the judgment result may indicate the L logic when all of the logic signals indicate the same logic value, and indicate the H logic when at least one of the logic signals indicates a different logic value from the rest. With such a configuration, the test apparatus 100 can make a collective judgment as to whether a larger number of devices under test 200 are acceptable.

The combining section 50 further includes therein a plurality of level comparing sections 56 and a match detecting section 58 in addition to the constituents of the combining sections 50 described with reference to FIGS. 1 to 5. The level comparing sections 56 are provided in a one-to-one correspondence with the devices under test 200. Each level comparing section 56 generates a level comparison result signal Sc whose logic value indicates whether the level of the response signal Sout output from a corresponding one of the devices under test 200 is higher than a predetermined reference value.

Each level comparing section 56 may receive the corresponding response signal Sout, which branches off from the wire between the corresponding switch 54 and the corresponding device under test 200. Each level comparing section 56 is supplied with the common threshold value VTH. When generating the combination signal Smix, the combining section 50 turns off the switches 54 corresponding to the devices under test 200. On the other hand, the combining section 50 turns on the switch 54-n corresponding to the match detecting section 58. Note that the switches 54 are preferably semiconductor switches which can be turned on/off at high speed.

The match detecting section 58 generates the combination signal Smix whose logic value indicates whether all of the logic values output from the level comparing sections 56 are the same at a predetermined timing. According to the present example, the match detecting section 58 is a match detecting circuit with N inputs (N is an integer indicating the number of devices under test 200). The match detecting section 58 outputs the logic value L when all of the response signals Sout have the same logic value at the same timing, and outputs the logic value H when at least one of the response signals Sout has a different logic value form the rest of the response signals Sout.

The level comparing section 12 detects the logic value of the combination signal Smix by comparing the level of the combination signal Smix output from the match detecting section 58 with the threshold value. Since the logic value of the combination signal Smix is one of the logic values H and L, the level comparing section 12 can easily distinguish between these logic values H and L.

The judging section 20 judges whether all of the devices under test 200 operate normally with reference to the logic value of the combination signal Smix which is detected by the level comparing section 12. Specifically speaking, the judging section 20 may detect whether the logic value of the combination signal Smix matches the expected value at a predetermined timing. For example, when judging that the logic value detected by the level comparing section 12 is the logic value L, the judging section 20 may judge that all of the devices under test 200 operate normally.

With the above-described configuration, the test apparatus 100 can also concurrently judge collectively whether all of the devices under test 200 operate normally. When judging that one or more of the devices under test 200 do not operate normally, the judging section 20 may individually judge whether the devices under test 200 are acceptable, similarly to the test apparatuses 100 described with reference to FIGS. 1 to 5. For example, the judging section 20 may individually judge whether the devices under test 200 operate normally in the following manner. The judging section 20 may cause the signal input section 10 to output the same test signal Sin to each device under test 200 and judges whether the logic value of the response signal Sout output from each device under test 200 matches the predetermined expected value.

In the above case, the switches 54 are used to switch the signal applied to the level comparing section 12 and the judging section 20, between the combination signal Smix and each of the response signals Sout. When the combining section 50 individually applies the response signals Sout, the switches 54 are controlled so as to select the response signal Sout output from the device under test 200 whose acceptability needs to be judged independently and apply the selected response signal Sout to the level comparing section 12. For example, when the judging section 20 independently judges whether the device under test 200-1 is acceptable, the combining section 50 turns on the corresponding switch 54-1 and turns off the other switches 54.

FIG. 7 illustrates an exemplary operation of the switches 54. According to the present example, a case is assumed where the test apparatus 100 tests eight devices under test 200. When writing data into the devices under test 200, the test apparatus 100 turns on the switches 54-1 to 54-8 corresponding to the devices under test 200, and turns off the switch 54-n corresponding to the match detecting section 58. This setting enables the test apparatus 100 to write data into the eight devices under test 200 concurrently.

When testing the eight devices under test 200 by concurrently reading data from the eight devices under test 200, the test apparatus 100 turns off the switches 54-1 to 54-8 corresponding to the devices under test 200, and turns on the switch 54-n corresponding to the match detecting section 58. This setting enables the test apparatus 100 to combine the response signals Sout from the eight devices under test 200 and to judge whether all of the devices under test 200 are acceptable.

When judging at least one of the devices under test 200 is defective, the test apparatus 100 controls the switches 54 so as to individually read the response signals Sout from the devices under test 200. Specifically speaking, as shown in FIG. 7, the test apparatus 100 sequentially selects one of the devices under test 200-1 to 200-8 to read data therefrom, turns on the corresponding switch 54 and turns off the rest of the switches 54. This setting enables the test apparatus 100 to individually judge whether the eight devices under test 200 are acceptable.

Figure 8:
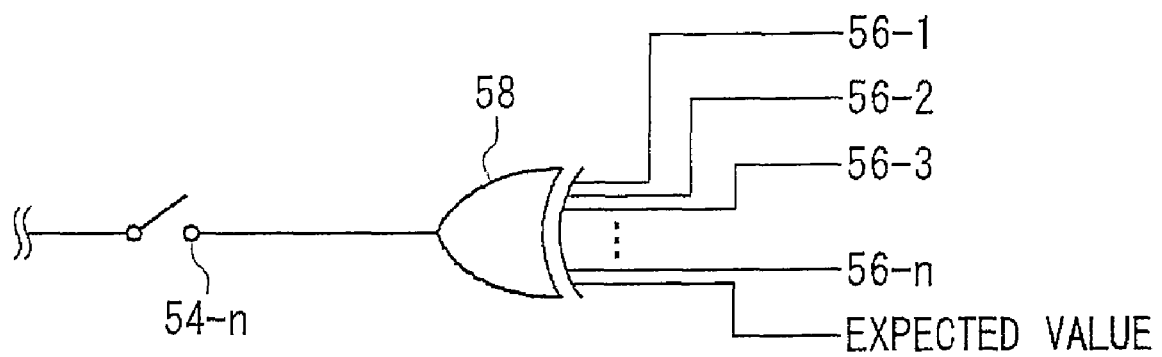
FIG. 8 illustrates a different exemplary configuration of a match detecting section 58.

FIG. 8 illustrates a different exemplary configuration of the match detecting section 58. The match detecting section 58 described with reference to FIG. 6 judges whether all of the response signals Sout have the same logic value. Therefore, the match detecting section 58 relating to FIG. 6 does not distinguish between when all of the response signals Sout have a logical value indicating normal operation and when all of the response signals Sout have a logical value indicating abnormal operation. According to the present example, the match detecting section 58 generates the combination signal Smix whose logical value indicates whether all of the logic values output from the level comparing sections 56 match the predetermined expected value at a predetermined timing. With such a configuration, the match detecting section 58 can generate the combination signal Smix indicating the logic value L when all of the response signals Sout have the logic value indicating normal operation and indicating the logic value H in the other cases.

A different exemplary configuration of the match detecting section 58 is explained in the following. The match detecting section 58 may include therein an 8-input AND gate which detects whether all of the response signals Sout indicate the logic value H and an 8-input NOR gate which detects whether all of the response signals Sout indicate the logic value L. When the match detecting section 58 does not distinguish between when all of the response signals Sout have the logic value indicating normal operation and when all of the response signals Sout have the logic value indicating abnormal operation (e.g., the match detecting section 58 described with reference to FIG. 6), the test apparatus 100 may calculate a logical OR between the outputs of the 8-input AND and NOR gates and compare the calculated logical OR with the expected value, to make the judgment about the acceptability. On the other hand, when the match detecting section 58 distinguishes between when all of the response signals Sout have the logic value indicating normal operation and when all of the response signals Sout have the logic value indicating abnormal operation (e.g., the match detecting section 58 described with reference to FIG. 8), the test apparatus 100 may judge whether one of the 8-input AND and NOR gates which corresponds to the expected value outputs the H logic, to make the judgment about the acceptability.

Figure 9:
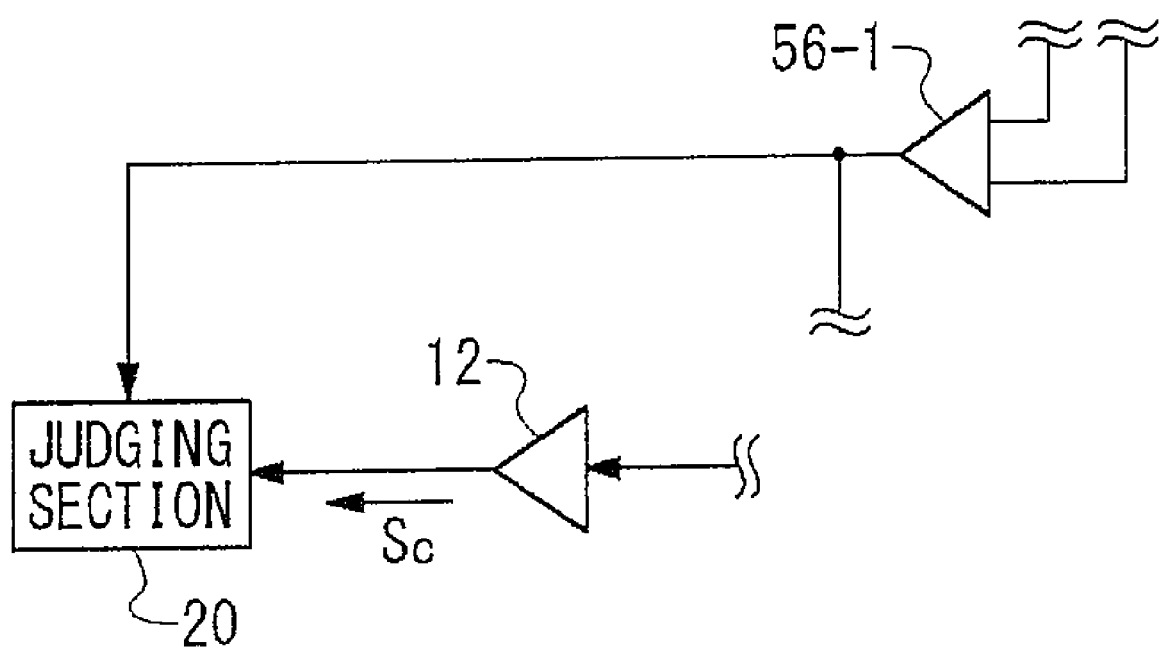
FIG. 9 illustrates a different exemplary configuration of a judging section 20.

FIG. 9 illustrates a different exemplary configuration of the judging section 20. As stated above, the match detecting section 58 described with reference to FIG. 6 generates the combination signal Smix indicating that all of the response signals Sout show the same logic value even when all of the response signals Sout show the logic value corresponding to abnormal operation. To deal with this issue, the judging section 20 relating to the present example is different from the judging section 20 described with reference to FIG. 6 in that the judging section 20 relating to the present example further judges whether the logic value output from one of the level comparing sections 56 is the same as the predetermined expected value. Except for this, the judging section 20 relating to the present example may have the same functionality and configuration as the judging section 20 described with reference to FIG. 6.

The judging section 20 may judge that all of the devices under test 200 operate normally when the combination signal Smix output from the match detecting section 58 has a predetermined logic value (for example, the logic value L indicating that all of the response signals Sout have the same logic value) and the logic value output from one of the level comparing sections 56 matches the expected value. With the above-described configuration, the test apparatus 100 can also accurately judge whether the devices under test 200 are acceptable, similarly to the test apparatus 100 using the match detecting section 58 illustrated in FIG. 8.

Figure 10:
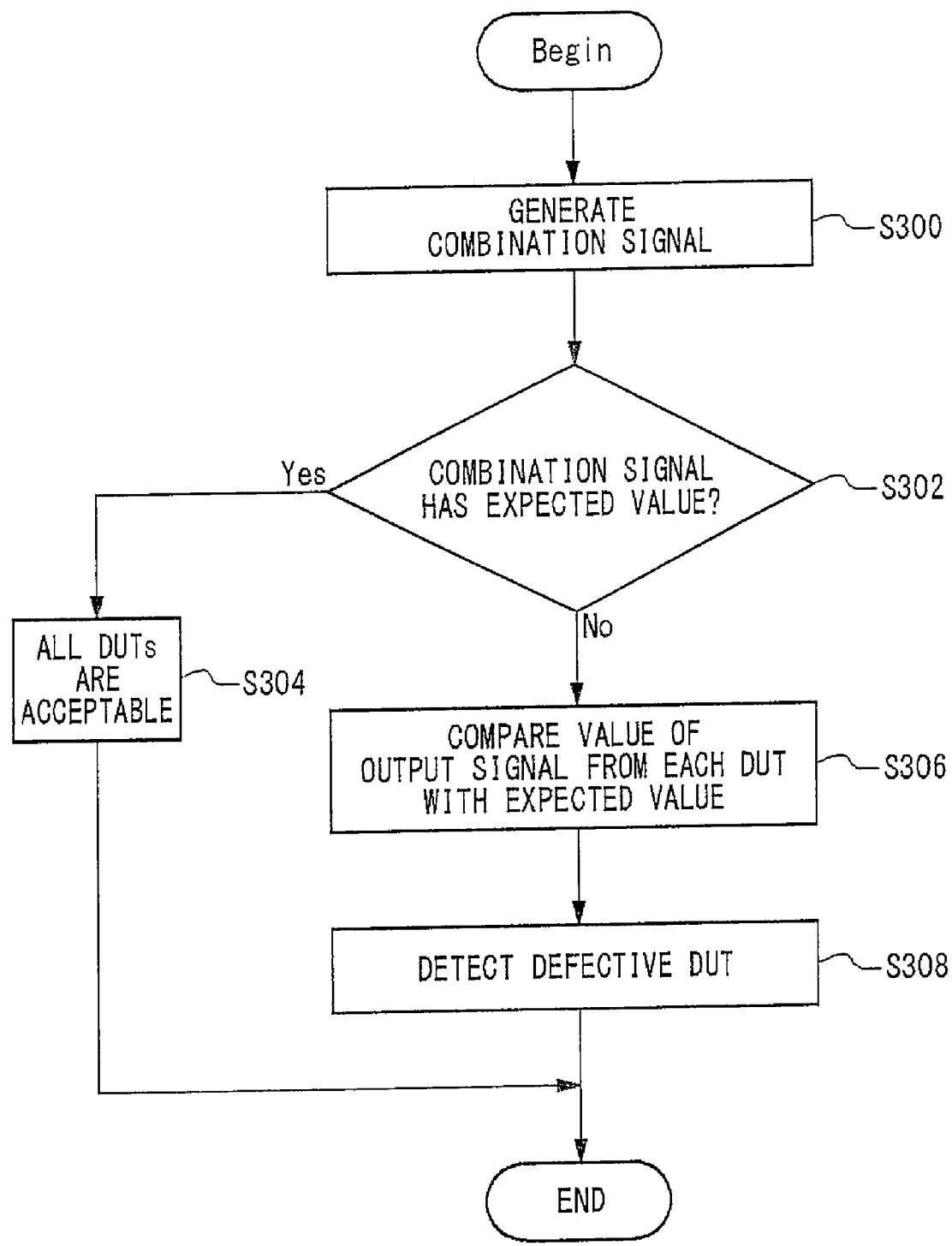
FIG. 10 is a flow chart illustrating an exemplary operation of the test apparatus 100.

FIG. 10 is a flow chart illustrating an exemplary operation of the test apparatus 100. In the following description of the present example, how the test apparatus 100 illustrated in FIG. 6 operates is explained, but the test apparatus 100 illustrated in FIG. 1 similarly operates. To begin with, the combining section 50 generates the combination signal Smix in order that the devices under test 200 are tested in parallel (step S300).

Subsequently, the judging section 20 judges whether the logic value of the combination signal Smix matches the expected value (step S302). When judging that the logic value of the combination signal Smix matches the expected value, the judging section 20 judges that all of the devices under test 200 operate normally, and the test ends (step S304). If such is the case, the test apparatus 100 may start the next test with the next test signal Sin.

When judging that the logic value of the combination signal Smix does not match the expected value, the judging section 20 individually detects the logic values of the output signals (response signal Sout) of the devices under test 200, and compares the individually detected logic values with the expected value (step S306). In this case, the test apparatus 100 may serially apply the individual response signals Sout to the level comparing section 12.

In this manner, the judging section 20 detects one or more defective devices under test 200 with reference to the result of comparing the logic value of each response signal Sout with the expected value (step S308). By operating in the above-described manner, the test apparatus 100 can efficiently test the devices under test 200.

Following the above judgment, the devices under test 200 that are judged non-defective may be serially tested. Therefore, the non-defective devices can be examined. Which is to say, only when defective devices are uncommonly found, the non-defective devices under test 200 may be serially tested. In the above-described manner, the present embodiment can improve the throughput of the device test as a whole. In addition, the present embodiment only requires one channel for the I/O signal terminals of the devices under test 200, thereby achieving excellent use efficiency for the test apparatus. Therefore, the test apparatus can test a larger number of devices under test 200 in parallel. This can reduce the testing costs.

Although some aspects of the present invention have been described by way of the exemplary embodiments, it should be understood that those skilled in the art might make many changes and substitutions without departing from the spirit and the scope of the present invention which is defined only by the appended claims.

For example, the test method described above can be used for an electronic device manufacturing method. The manufacturing method may include a step of forming electronic devices and a step of selecting one or more electronic devices that normally operate by testing the formed electronic devices. In this manner, the manufacturing method manufactures electronic devices that operate normally. In the selecting step, the normally-operating electronic devices may be selected by using the test methods described with reference to FIGS. 1 to 10.

As is apparent from the above description, the test apparatus 100 can efficiently judge, for devices under test, whether all of the devices under test are acceptable. When judging that one or more of the devices under test are defective, the test apparatus 100 individually tests the devices under test. In this way, the test apparatus 100 can individually test a plurality of devices under test with it being possible to shorten the testing time.

What is claimed is:

1. A test apparatus for testing a plurality of devices under test, comprising:
    a signal input section that applies a test signal to the devices under test so as to cause the devices under test to concurrently output response signals that are the same as each other;
    a combining section that generates a single combination signal by using the response signals output from the devices under test;
    a judging section that judges whether the devices under test operate normally with reference to the combination signal; and
    a calibration section that measures, prior to the test of the devices under test, a level of the combination signal which is generated when causing one or more of the devices under test and the one or more remaining devices under test to output response signals such that the response signals output by the one or more devices under test have logic values different from those output by the one or more remaining devices under test, and designates the threshold value in accordance with the measured level of the combination signal, wherein
    the combining section generates a signal by combining the response signals in an analog manner, as the combination signal, and
    the judging section judges whether the devices under test operate normally by determining whether a signal level of the combination signal is higher than a predetermined threshold value at a predetermined timing.

2. The test apparatus as set forth in claim 1, further comprising
    a level comparing section that compares the signal level of the combination signal with the threshold value, wherein
    the combining section includes therein a plurality of wires provided in a one-to-one correspondence with the devices under test, and
    each of the wires electrically connects a signal output terminal of a corresponding one of the devices under test to a signal input terminal of the level comparing section, so that the wires generate the combination signal and apply the generated combination signal to the level comparing section.

3. The test apparatus as set forth in claim 1, wherein
    prior to the test, the calibration section sequentially varies the number of the devices under test that output the response signals having the different logic value from the remaining devices under test, measures levels of the combination signal in a one-to-one correspondence with the sequentially varied numbers, and calculates threshold values with reference to the measured levels of the combination signal, and
    the judging section detects how many of the devices under test operate normally, with reference to a level comparison result signal obtained by comparing the level of the combination signal generated by combining the response signals during the test of the devices under test with each of the calculated threshold values.

4. The test apparatus as set forth in claim 1, wherein
    when judging that one or more of the devices under test do not operate normally, the judging section individually judges whether the devices under test operate normally with reference to the individual response signals.

5. The test apparatus as set forth in claim 4, further comprising
    an enabling control section that supplies a signal to one or more of the devices under test which are judged by the judging section not to operate normally, the signal indicating that the one or more devices under test are prohibited from outputting the response signals, and permits the test apparatus to continue testing the remaining devices under test.

6. The test apparatus as set forth in claim 1, wherein
    prior to the test of the devices under test, the judging section confirms that an output of each of the devices under test is not fixed to high impedance, with reference to the combination signal generated by combining the response signals.

7. The test apparatus as set forth in claim 1, wherein
    the judging section judges whether all of the devices under test operate normally or at least one of the devices under test operates abnormally, with reference to the combination signal.

8. A test method for testing a plurality of devices under test, comprising:
    applying a test signal to the devices under test so as to cause the devices under test to concurrently output response signals that are the same as each other;
    generating a single combination signal using the response signals output from the devices under test by combining the response signals in an analog manner, as the combination signal;
    judging whether the devices under test operate normally with reference to the combination signal by determining whether a signal level of the combination signal is higher than a predetermined threshold value at a predetermined timing; and
    measuring, prior to the test of the devices under test, a level of the combination signal which is generated when causing one or more of the devices under test and the one or more remaining devices under test to output response signals such that the response signals output by the one or more devices under test have logic values different from those output by the one or more remaining devices under test, and designating the threshold value in accordance with the measured level of the combination signal.

9. A manufacturing method for manufacturing electronic devices, comprising:
    forming a plurality of electronic devices; and
    selecting one or more of the electronic devices which operate normally by testing the formed electronic devices, to manufacture normally-operating electronic devices, wherein
    the selecting includes:
    applying a test signal to the electronic devices so as to cause the electronic devices to concurrently output response signals that are the same as each other;

generating a single combination signal using the response signals output from the electronic devices by combining the response signals in an analog manner, as the combination signal; and judging whether the electronic devices operate normally with reference to the combination signal by determining whether a signal level of the combination signal is higher than a predetermined threshold value at a predetermined timing, the manufacturing method further including measuring, prior to the selecting, a level of the combination signal which is generated when causing one or more of the electronic devices and the one or more remaining electronic devices to output response signals such that the response signals output by the one or more electronic devices have logic values different from those output by the one or more remaining electronic devices, and designating the threshold value in accordance with the measured level of the combination signal.

* * * * *